United States Patent
Becker et al.

(10) Patent No.: US 7,673,271 B1
(45) Date of Patent: Mar. 2, 2010

(54) ENHANCING RELOCATABILITY OF PARTIAL CONFIGURATION BITSTREAMS

(75) Inventors: Tobias J. Becker, Bergisch Gladbach (DE); Brandon J. Blodget, Santa Clara, CA (US)

(73) Assignee: Xilinx, Inc., San Jose, CA (US)

( * ) Notice: Subject to any disclaimer, the term of this patent is extended or adjusted under 35 U.S.C. 154(b) by 548 days.

(21) Appl. No.: 11/599,134

(22) Filed: Nov. 14, 2006

(51) Int. Cl.
*G06F 17/50* (2006.01)
*H03K 17/693* (2006.01)

(52) U.S. Cl. .............................. 716/16; 716/11; 716/17
(58) Field of Classification Search ...................... 716/3, 716/11, 16–17
See application file for complete search history.

(56) References Cited

U.S. PATENT DOCUMENTS

| | | | | |
|---|---|---|---|---|
| 6,173,434 B1 * | 1/2001 | Wirthlin et al. | ............... | 716/17 |
| 6,408,422 B1 * | 6/2002 | Hwang et al. | .................. | 716/3 |
| 6,539,532 B1 * | 3/2003 | Levi et al. | ..................... | 716/16 |
| 2003/0173993 A1 * | 9/2003 | Gupta | ......................... | 326/41 |
| 2005/0193358 A1 * | 9/2005 | Blodget et al. | ................ | 716/17 |

OTHER PUBLICATIONS

"Parbit: A tool to Transform Bitfiles to Implement Partial Reconfiguration of Field Programmable Gate Arrays (FPGAs)", by Edson L. Horta, John W. Lockwood, http://www.arl.wustl.edu/~lockwood/publications/parbit.pdf @ 2001.*
Huang, Dennis J.-H. et al., "Partitioning-Based Standard-Cell Global Placement With an Exact Objective," *Proc. of the 1997 International Symposium on Physical Design*, Feb. 14-16, 1997, pp. 18-25, Napa, California, USA.

* cited by examiner

*Primary Examiner*—Paul Dinh
*Assistant Examiner*—Nha T Nguyen
(74) *Attorney, Agent, or Firm*—W. Eric Webostad

(57) ABSTRACT

Enhancing relocatability of partial configuration bitstreams from a first area to a second area of programmable logic of an integrated circuit is described. A first set and a second set of logic resources of the programmable logic are identified. The first set and the second set of logic resources are respectively associated with the first area and the second area, the second area being wholly or partially offset from the first area. Differences between the first set of logic resources and the second set of logic resources are identified. The differences are associated with one or more of different types of circuit resources in each of the first area and the second area. Prohibit constraints associated with the differences are set.

17 Claims, 12 Drawing Sheets

ENHANCING RELOCATABILITY OF PARTIAL CONFIGURATION BITSTREAMS

FIELD OF THE INVENTION

One or more aspects of the invention relate generally to integrated circuits and, more particularly, to enhancing relocatability of partial configuration bitstreams for configuring programmable logic.

BACKGROUND OF THE INVENTION

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. Notably, as used herein, "include" and "including" mean including without limitation.

One such FPGA is the Xilinx Virtex® FPGA available from Xilinx, Inc., 2100 Logic Drive, San Jose, Calif. 95124. Another type of PLD is the Complex Programmable Logic Device ("CPLD"). A CPLD includes two or more "junction blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. Other PLDs are programmed by applying a processing layer, such as a metal layer, that programmably interconnects the various elements on the device. These PLDs are known as mask programmable devices. PLDs can also be implemented in other ways, for example, using fuse or antifuse technology. The terms "PLD" and "programmable logic device" include but are not limited to these exemplary devices, as well as encompassing devices that are only partially programmable.

For purposes of clarity, FPGAs are described below though other types of PLDs may be used. FPGAs may include one or more embedded microprocessors. For example, a microprocessor may be located in an area reserved for it, generally referred to as a "processor block."

Conventionally, modules of a design instantiated in programmable logic of an FPGA ("FPGA fabric") had very limited relocation possibilities. Heretofore, a module could only be instantiated in areas with equivalent logic layers and configuration memory layers. By equivalent logic layers for a columnar architected FPGA, it is meant an equivalent ordered set of stripes of columns of circuit resources, namely horizontally equivalent circuit resources. By equivalent configuration memory layers for a columnar architected FPGA, it is meant an equivalent mapping of resources to configuration memory, namely vertically equivalent configuration memory.

Accordingly, the mapping of configuration memory from one area of an FPGA to another area of the FPGA for identical logic layers and equivalent configuration memory layers may simply have involved offset addressing. Thus, having a portable module which could be instantiated in equivalent logic layer level areas of an FPGA meant the partial configuration bitstream ("partial bitstream") associated with such module would have the same mapping for each of the different areas, except with some offset addressing. Thus, for example, if there were four areas on a FPGA designated for use of a module, then each of those four areas would have identical logic and configuration memory layers. Notably, as used herein, the term "configuration bitstream" generally refers to a bitstream that is used to completely instantiate a design in an FPGA. In contrast, the term "partial bitstream" generally refers to a bitstream that is used to instantiate only part of a design in an FPGA. A partial bitstream may be used to reconfigure a part of a design instantiated in an FPGA.

However, having to have identical logic and configuration memory layers for instantiation of a modular partial bitstream in different areas of an FPGA limits the possible locations for such instantiation. This limitation may be a constraint on the number of different types of modules that may be instantiated or may impose a greater commitment of FPGA fabric to accommodate such different types of modules than desirable, possibly resulting in having to purchase a larger, more expensive FPGA.

Accordingly, it would be desirable and useful to provide means to enhance the relocatability of partial bitstreams within an FPGA.

SUMMARY OF THE INVENTION

One or more aspects of the invention generally relate to integrated circuits and, more particularly, to enhancing relocatability of partial configuration bitstreams for configuring programmable logic.

An aspect of the invention is a method of enhancing relocatability of a partial bitstream from a first area to a second area of programmable logic of an integrated circuit. A first set of logic resources of the programmable logic and a second set of logic resources of the programmable logic are identified. The first set of logic resources is associated with the first area, and the second set of logic resources is associated with the second area, the second area being wholly or partially offset from the first area. Differences between the first set of logic resources and the second set of logic resources are identified. The differences are associated with one or more of different types of circuit resources in each of the first area and the second area. Prohibit constraints associated with the differences are set.

Another aspect of the invention is a method for modular design in programmable logic of an integrated circuit. Partial bitstreams associated with modules of the modular design are provided. At least a portion of the partial bitstreams are not limited to being relocated to a substantially identical logic layer with respect to a reference logic layer. The portion of the partial bitstreams is configured for relocation to at least one non-substantially identical logic layer with respect to the reference logic layer.

Yet another aspect of the invention is a modular configuration bitstream for configuration of programmable logic of an integrated circuit. The modular configuration bitstream has a plurality of block bitstreams, each of the block bitstreams having various sections and being derived from a partial bitstream associated with a reference logic layer. Configuration data from the partial bitstream is divided into data blocks, and each data block is used for providing a respective one of the block bitstreams. A first portion of the block bitstreams is associated with instantiation of a module of a user design in the programmable logic. A second portion of the block bitstreams is associated with a masked off portion of the programmable logic. The first portion and the second portion are associated with a target logic layer offset from the reference logic layer, the target logic layer not having to be substantially identical to the reference logic layer responsive to the second portion.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Figure 1:
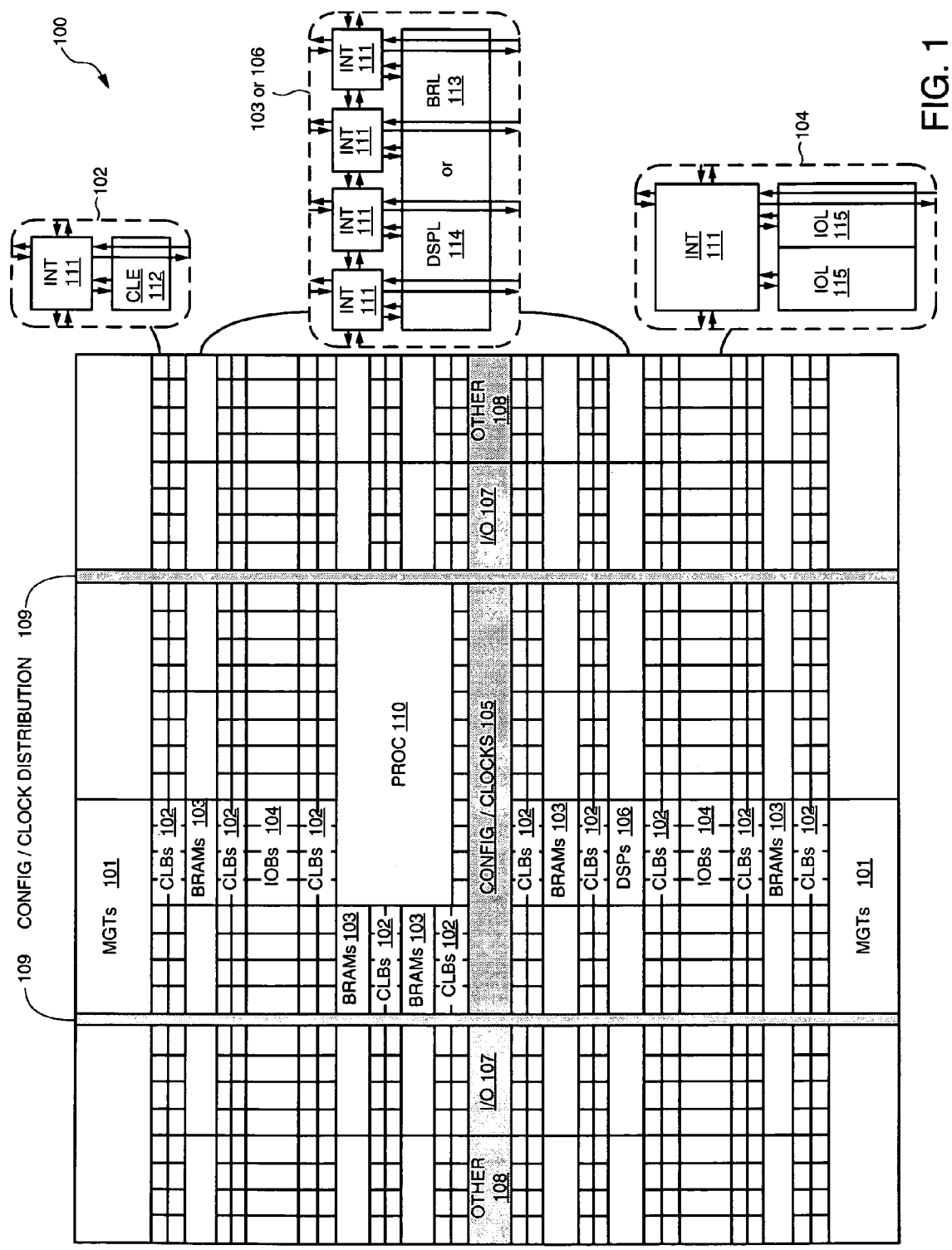
FIG. 1 is a simplified block diagram depicting an exemplary embodiment of a columnar Field Programmable Gate Array ("FPGA") architecture in which one or more aspects of the invention may be implemented.

FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output ports ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element 111 in each adjacent tile. Therefore, the programmable interconnect elements 111 taken together implement the programmable interconnect structure for the illustrated FPGA. Each programmable interconnect element 111 also includes the connections to and from any other programmable logic element(s) within the same tile, as shown by the examples included at the right side of FIG. 1.

For example, a CLB 102 can include a configurable logic element ("CLE") 112 that can be programmed to implement user logic plus a single programmable interconnect element 111. A BRAM 103 can include a BRAM logic element ("BRL") 113 in addition to one or more programmable interconnect elements 111. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element ("DSPL") 114 in addition to an appropriate number of programmable interconnect elements 111. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 are manufactured using metal layered above the various illustrated logic blocks, and typically are not confined to the area of the I/O logic element 115.

In the pictured embodiment, a columnar area near the center of the die (shown shaded in FIG. 1) is used for configuration, I/O, clock, and other control logic. Vertical areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the right side of FIG. 1 are purely exemplary. For example, in an actual FPGA more than one adjacent column of CLBs is typically included wherever the CLBs appear, to facilitate the efficient implementation of user logic. FPGA 100 illustratively represents a columnar architecture, though FPGAs of other architectures, such as ring architectures for example, may be used. FPGA 100 may be a Virtex-4™ FPGA from Xilinx of San Jose, Calif.

Figure 2:
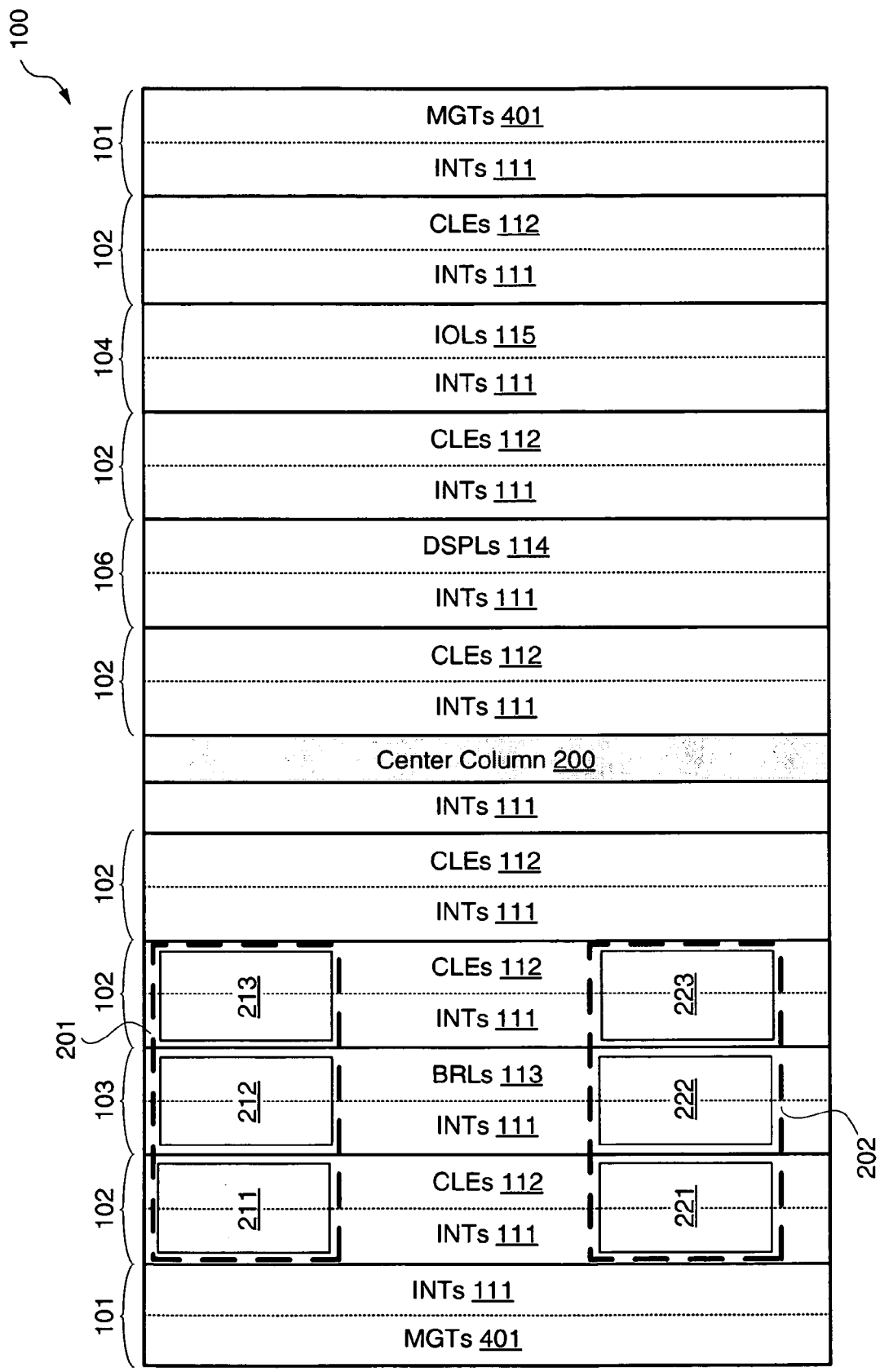
FIG. 2 and FIG. 3 are simplified block diagrams depicting an exemplary embodiment of an FPGA, such as the FPGA of FIG. 1.
Figure 3:
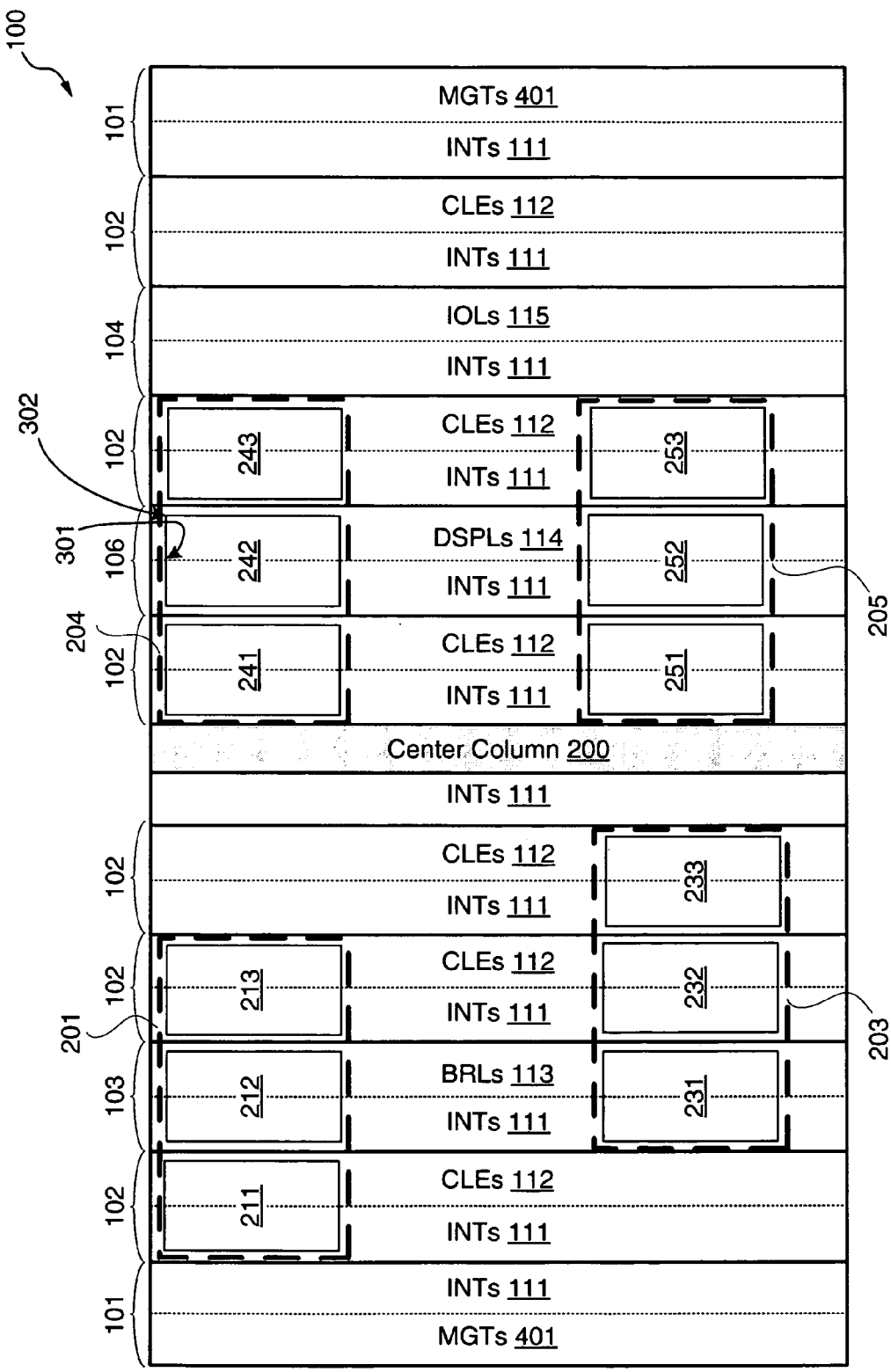

FIG. 2 and FIG. 3 are simplified block diagrams depicting an exemplary embodiment of an FPGA, such as FPGA 100 of FIG. 1. In FIG. 2, areas have been designated with dashed boxes 201 and 202. In FIG. 3, areas have been designated with dashed boxes 201, 203, 204, and 205. Hereafter, these areas in FIGS. 2 and 3 shall be identified as areas 201, 202, 203, 204, and 205, as respectively associated with the dashed boxes which they denote.

Area 201 includes three regions, namely regions 211, 212, and 213. Region 211 is a CLB region, including portions of INTs 111 and CLEs 112 of a CLB column 102. Region 212 includes a portion of INTs 111 and BRLs 113 of a BRAM column 103. Region 213 includes portions of INTs 111 and CLEs 112 of another CLB column 102. Region 212 has region 211 on a left side and region 213 on a right side thereof.

Area 202 includes regions 221 through 223. Region 221, on a left side of region 222, includes a portion of INTs 111 and a portion of CLEs 112 of the same CLB column 102 as region 211. Region 222 includes a portion of INTs 111 and BRLs 113 of the same BRAM column 103 as region 212. Region 223 includes a portion of INTs 111 and a portion of CLEs 112 of the same CLB column 102 as region 213.

Notably, regions 211 through 213 and 221 through 223 have equivalent vertical heights though they are located at different positions. Regions 211 through 213 occupy equivalent sets of configuration memory cells with respect to relative vertical address locations ("row addresses") in FPGA 100. Regions 221 through 223 likewise occupy equivalent sets of configuration memory cells with respect to row addresses in FPGA 100. Moreover, the respective vertical heights of regions 211 through 213 and regions 221 through 223 are equivalent, namely they each occupy a same number of rows; however, regions 221 through 223 are located below regions 211 through 213 meaning different row addresses between the two groups of regions.

Regions 211 through 213 are mapped to different configuration memory cells than regions 221 through 223. Even though areas 201 and 202 occupy equivalent logic layers, namely a CLB column, a BRAM column, and another CLB column in that order, they may not have equivalent mapping of configuration memory cells. This is because in some FPGAs there is a bit reversal between top and bottom halves of a column. However, if there were no bit reversal, areas 201 and 202 would have equivalent logic and configuration memory layers.

Prior to now, a partial bitstream associated with instantiating a circuit in programmable logic of area 201 could not be ported to programmable logic in area 202 if there was bit reversal. In other words, prior to now there was no means to address bit reversal between otherwise equivalent logic and configuration memory layers.

In FIG. 3, area 204 includes region 241 on a left side of region 242, and region 243 on a right side of region 242. Regions 241 through 243 and regions 211 through 213 have equivalent vertical heights. Moreover, regions 211 through 213 are in the same upper half of FPGA 100 as regions 241 through 243, and thus there is no bit reversal issue between areas 201 and 204. However, region 242 includes portions of INTs 111 and DSPLs 114 of a DSP column 106 in contrast to region 212 which includes portions of INTs 111 and BRLs 113 of a BRAM column 103. Accordingly, areas 201 and 204 do not have logically equivalent layers.

Area 203 includes regions 231 through 233 respectively corresponding to portions of a BRAM column 103, a CLB column 102, and another CLB column 102. Regions 251 through 253 of area 205 in order respectively include portions of a CLB column 102, a DSP column 106, and another CLB column 102. Accordingly, assuming area 201 is an original area of instantiation of a partial bitstream, then logical layers between target areas 203 through 205 would not be equivalent to the logic layer of area 201. Moreover, target areas 203 and 205 have different configuration memory cell layers than that of area 201 due to bit reversals between top and bottom halves of a column of an FPGA 100.

However, it should be appreciated that a design to be instantiated in any of areas 201 through 205 of FIGS. 2 and 3 may not necessarily be using resources in each of the columns of those areas. For example, a design to be instantiated in area 201 may in instances only use CLEs 112 associated with regions 211 and 213, and may not use any BRLs 113 associated with region 212. In other words, such a design to be instantiated may only use INTs associated with region 212 for coupling regions 211 and 213 to one another.

Figure 4:
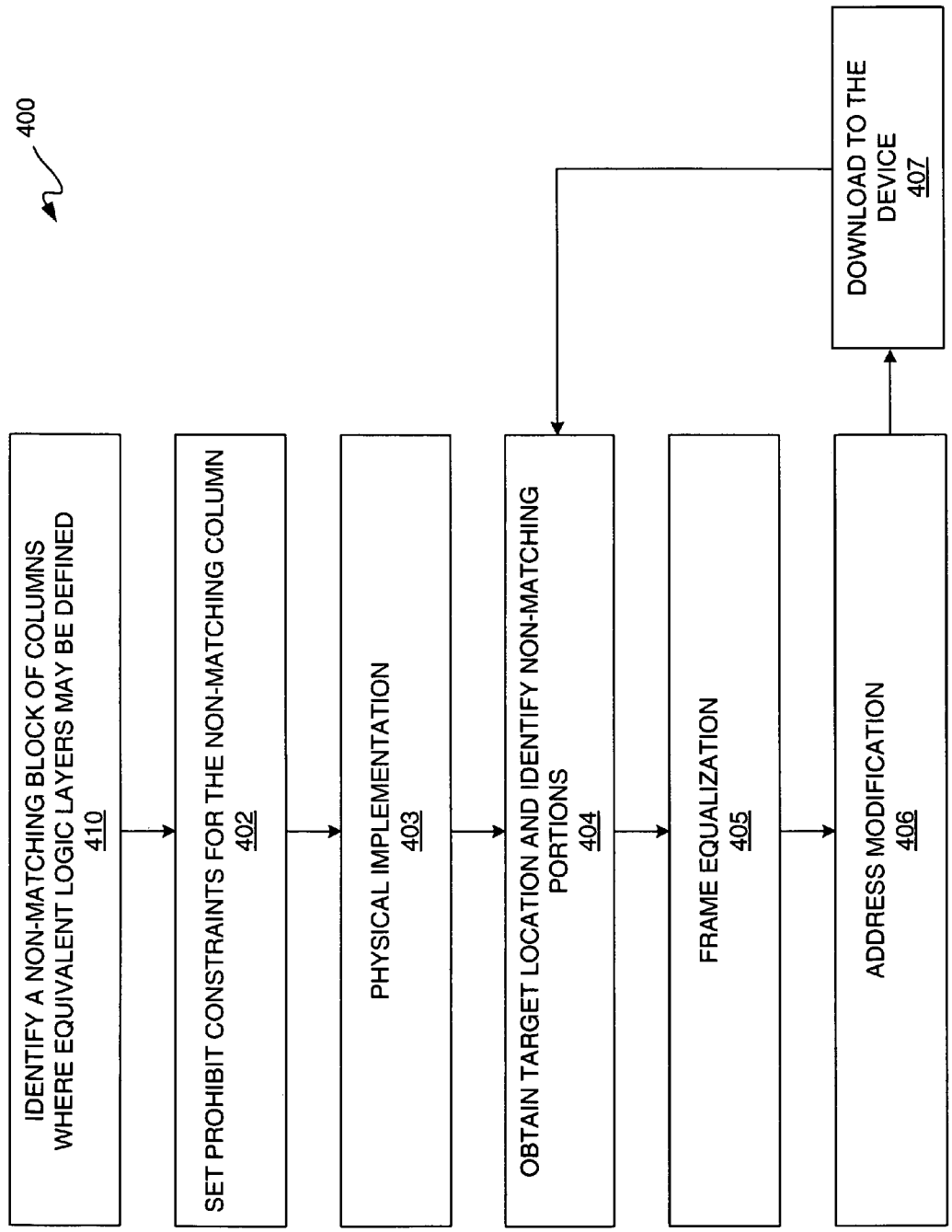
FIG. 4 is a flow diagram depicting an exemplary embodiment of a design constraints flow which may be used for relocating a modular partial bitstream.

FIG. 4 is a flow diagram depicting an exemplary embodiment of a design constraints flow 400 which may be used for relocating a modular partial bitstream. At 410, a non-matching block of columns where equivalent logic layers may be defined is identified. For example, with reference to FIG. 3, if an original partial bitstream was instantiated in area 204, then area 201 would be a non-matching block of columns, or more particularly portions of columns, where equivalent logic layers may be defined. This is because DSPLs 114 associated with region 242 may be blocked off for purposes of porting the original partial bitstream associated with area 204 to area 201. For example, initial X and Y coordinates generally indicated at 301 and final X and Y coordinates generally indicated at 302 of DSPLs 114 associated with region 242 may be defined as configuration prohibit constraints. For example, configuration prohibit constraints may be set to DSP48_X0Y16:DSP48_X0Y31 for a Xilinx FPGA with DSPLs to block off DSPLs from being used in the address region defined by X0Y16 to X0Y31. However of course this is merely an example, and there are many other X and Y addresses that may be used. Notably, configuration prohibit constraints are not part of a configuration bitstream for configuring an FPGA for example. Rather, at "design time," in contrast to runtime, prohibit constraints are used to avoid the use of non-identical resources by software implementation tools, such as may be obtained for example from Xilinx, Inc. of San Jose, Calif.

At 402, X and Y prohibit constraints for one or more non-matching columns are set. Notably, there may be more than one non-matching column between an original location and a target location to which a module is being relocated. At 403, the design may be physically implemented using known software implementation tools, such as for mapping, place and route, and bit generation ("bitgen"), and such physical implementation may be subject to all design constraints including prohibit constraints. So, for example, a designer who identifies areas 201 and 204 as possible areas for instantiation of a module, non-matching columns as between such areas may be accounted for, as described below in additional detail. Notably, prohibit constraints are initially only for the original partial bitstream, as one or more modular partial bitstreams derived from it are may be targeted at new areas which are in effect at present "empty" of configuration information. Physical implementation may be used at design time to produce a modular partial bitstream for a specific area. In other words, for a designer who wants to implement only one version of a module, which may or may not be physically implemented in the area of origin during runtime, and then effectively configure the module for relocation to another area at or during runtime, only one instance of the module may be stored for physical implementation. Because only one version of the module is stored as a partial bitstream from which one or more other modules may be generated for relocation, configuration database memory usage may be conserved.

A partial bitstream used at 403 may be used for a target location obtained at 404 for instantiation in a "new" area at or during runtime. This "new" area for this example is meant to be an area other than the specific area used for physical implementation at 403 at design time. For instantiation in a new area or target location, bitstream data is modified in steps 405 and 406. A function which evaluates the new area for relocation of the partial bitstream has information about the FPGA structure, and thus is capable of identifying non-identical parts of a configuration bitstream responsive to the new area of instantiation for carrying out the modifications used at operations 405 and 406. At 405, any non-matching configuration memory frames associated with the non-matching columns may be equalized in number It should be appreciated that a partial bitstream has a bit length, where bits are grouped in configuration frames. Thus equalization of frames may involve adding one or more padding frames or removing one or more logic configuration frames. At 406, the addresses of configuration data blocks of the modular partial bitstream are modified to match the new area of instantiation. Thus, a partial bitstream may be relocated and translated responsive to revised configuration information for instantiation in the new area as generally indicated by downloading the partial bitstream as modified at or during runtime to the device, such as an FPGA, at 407. This may be repeated for another new area or target location by returning to 404.

Figure 5:
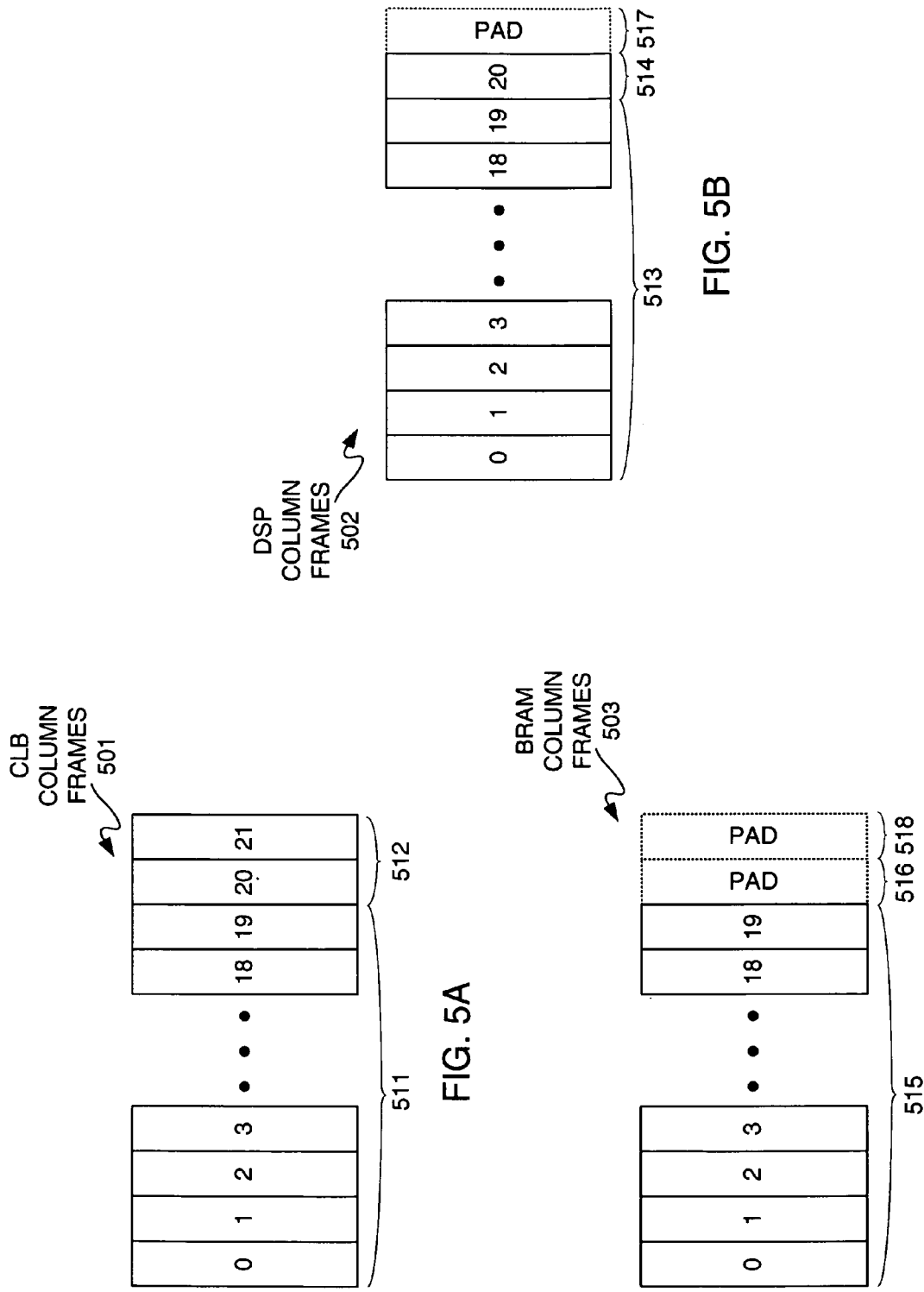
FIGS. 5A through 5C are respective block diagrams depicting exemplary embodiments of configurable logic block ("CLB") column frames, digital signal processing block ("DSP") column frames, and dedicated random access memory block ("BRAM") column frames, respectively.

FIGS. 5A through 5C are respective block diagrams depicting exemplary embodiments of CLB column frames 501, DSP column frames 502, and BRAM column frames 503, respectively. A CLB column of a Xilinx FPGA includes 22 frames; of the 22 frames, frames 0 through 19 are configuration routing frames 511. Frames 20 and 21 are slice configuration frames 512. For DSP column frames 502 of a Xilinx FPGA, frames 0 through 19 are routing configuration frames 513, and frame 20 is a DSP configuration frame 514. For BRAM column frames 503, frames 0 through 19 are routing configuration frames 515, and there is no separate BRAM configuration frame.

With continuing reference to FIGS. 5A, 5B, and 5C, various examples of equalization of number of frames are described. For the example of porting the partial bitstream associated with area 204 to area 201 of FIG. 3, configuration frames associated with region 242 are to be equalized with configuration frames of region 212. In short, this means that because the routing configuration frames are the same, namely frames 0 through 19 are the same in number in each of the sets of column frames 501 through 503, only the logic configuration frames need to be adjusted for. This means the logic configuration frames associated with DSPLs 114, of which there is one in this example, as associated with region 242 have to be equalized with the logic configuration frames associated with BRLs 113 of region 212 of FIG. 3. In this example of a conversion from DSPLs 114 to BRLs 113 for a Xilinx FPGA, namely to equalize DSP logic configuration frames with BRAM logic configuration frames, the last frame of the DSP column frame 502, namely frame 514 is removed. For the reverse example of a BRAM-to-DSP equalization, a frame 516 is added as a pad frame to the end of BRAM routing configuration frames 515.

Along the lines of the above-described examples, equalization of frames from CLB to DSP column frames would involve removing the last frame, namely frame 21 in this example, of CLB column frames 501. Notably, frames 20 and 21 of CLB column frames would effectively carry no configuration information because the CLB column would be blocked off as a non-matching column by prohibit constraints during design time. Equalization going from DSP to CLB column frames would involve adding a pad frame 517 to DSP column frames 502 after DSP logic configuration frame 514. Likewise, DSP logic configuration frame 514 would not carry any configuration data because the DSP column would be blocked off at design time by prohibit constraints. Additionally, equalization going from CLB to BRAM column frames would involve removing frames 512, namely the last two frames 20 and 21 of CLB column frames 501. Lastly, going from BRAM to CLB column frames would involve adding pad frames 516 and 518 to BRAM routing configuration frames 515. Notably, frame equalization adjusts the bit length of configuration data for the memory structure of non-matching columns while preserving the configuration routing frames 0 to 19. Pad frames or blocked off frames do not carry configuration information and leave non-matching CLEs 112, BRLs 113 and DSPLs 114 unconfigured.

At runtime, the partial bitstream associated with area 204 may be modified with frame equalization of operation 405 and address modification of operation 406 resulting from flow 400 of FIG. 4 for a horizontal translation of such partial bitstream to area 201. Notably, frame equalization of operation 405 and address modification of operation 406 may also be executed at design time. The bitstream associated with area 204 may be transformed into a bitstream for area 201 at design time and loaded at runtime without further modifications. However, this would impose additional storage requirements to the system for keeping multiple version of the bitstream in memory. Notably, in the following description, a partial bitstream is described as being parsed into smaller bitstreams. However, the partial bitstream need not be parsed; rather, the original bitstream may be modified for a translation (i.e., translating address information in an original configuration bitstream) into one new contiguous bitstream consisting of a preamble, modified address, data section, and a postamble, for example. However, in some instances processing may be facilitated by parsing the partial bitstream, and thus the following examples are in terms of parsing a partial bitstream even though this is not required.

Figure 6:
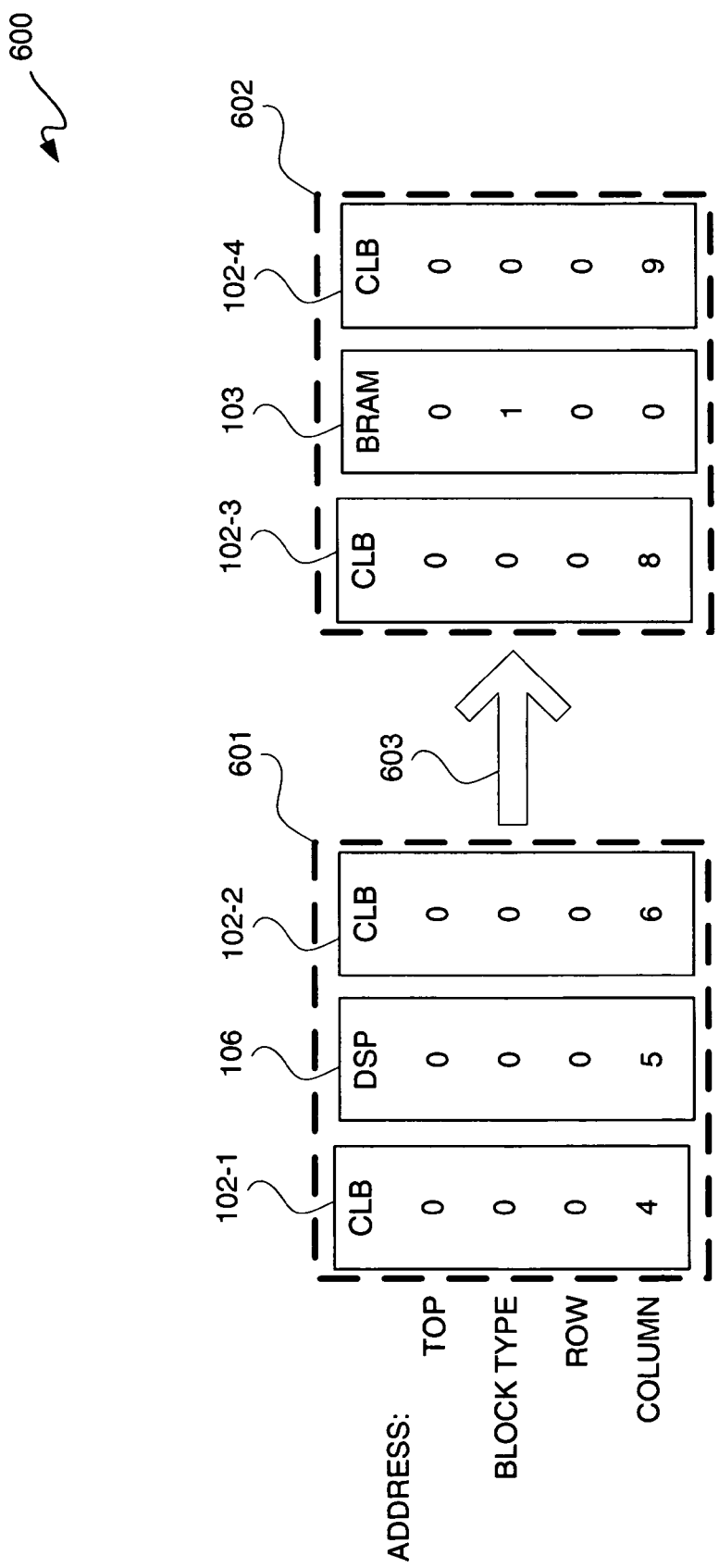
FIG. 6 is a block/flow diagram depicting an exemplary embodiment of a horizontal translation flow.

For horizontal translation, bitstream relocation involves parsing the partial bitstream. FIG. 6 is a block diagram depicting an exemplary embodiment of a horizontal translation flow 600. Horizontal translation flow 600 is to relocate a partial bitstream associated with original location 601 to relocation target 602 via a horizontal translation 603. Notably, a location in this example may be an area, as previously described with reference to FIGS. 2 and 3. Additionally, for clarity it shall be assumed that a horizontal translation only is being done. Original location 601 includes a CLB column 102-1, a DSP column 106, and a CLB column 102-2. Relocation target 602 includes a CLB column 102-3, a BRAM column 103, and a CLB column 102-4. Examples of addresses for the partial bitstream for each of the portions of such columns 102-1 through 102-4, 103, and 106 are provided. These are merely example values for purposes of clarity by way of example, and are not in any way intended to be the only numerical addresses that may be used. CLB column 102-1 has top, block type, row, and column address 0,0,0,4. DSP column 106 has top, block type, row, and column address 0,0,0,5. Lastly, CLB column 102-2 has top, block type, row, and column address 0,0,0,6. After horizontal translation 603 of original location 601 to relocation target 602, columns 102-1, 106, and 102-2 are mapped to columns 102-3, 103, and 102-4, respectively. CLB column 102-3 has top, block type, row, and column address 0,0,0,8. BRAM column 103 has top, block type, row, and column address 0,1,0,0. Lastly, CLB column 102-4 has top, block type, row, and column address 0,0,0,9.

Figure 7:
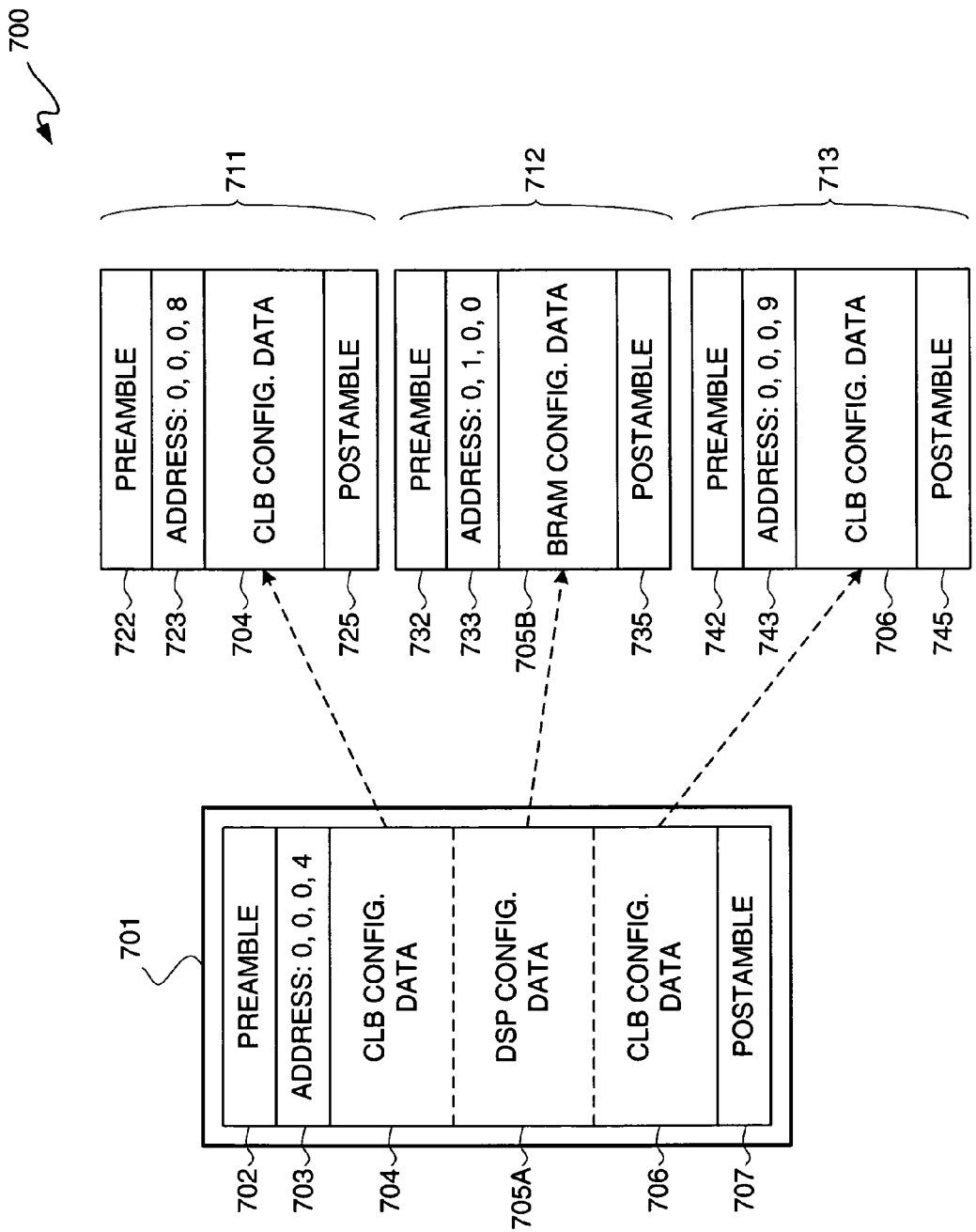
FIG. 7 is a block/flow diagram depicting an exemplary embodiment of sequential bitstream parsing flow using the example of the horizontal translation of FIG. 6.

FIG. 7 is a block/flow diagram depicting an exemplary embodiment of sequential bitstream parsing flow 700. Continuing the example of FIG. 6, a partial bitstream 701 includes a preamble 702, a starting address 703, CLB configuration data 704, DSP configuration data 705A, and CLB configuration data 706, as well as a postamble 707. In this example, the starting address is the same address as CLB column 102-1 of FIG. 6. Notably, there is no configuration data for DSP configuration data region 705A other than routing configuration data.

Partial bitstream 701 is sequentially parsed into three partial bitstreams 711, 712, and 713. Each partial bitstream 711 through 713 may be independently transferred for each associated configuration block 704, 705A, and 706, respectively. Thus, partial bitstream 711 includes a preamble 722, starting address 723, CLB configuration data 704 obtained from partial bitstream 701, and a postamble 725. Notably, preamble 722 and postamble 725 may be obtained respectively from preamble 702 and postamble 707 of partial bitstream 701. Additionally, if any column is to be blocked off, such as for example a column of DSPLs, BRLs, IOLs, or other column, prohibit constraint addresses for such may optionally be included in the preamble. For example, addresses associated with prohibit constraints may optionally be located in the preamble for the parsed partial bitstream where frames need to be removed or pad frames need to be added.

Starting address 723 is a generated address for the horizontal translation. Accordingly, for the above example of FIG. 6, address 0,0,0,8, associated with CLB column 102-3 is used for the starting address of partial bitstream 711.

Partial bitstream 712 includes preamble 732, starting address 733, BRAM configuration data 705B, and postamble 735. Information for preamble 732 and postamble 735 may be obtained from preamble 702 and postamble 707, respectively, of partial bitstream 701. Starting address 733, continuing the above example of FIG. 6, is obtained as the address associated with BRAM column 103 of FIG. 6, namely 0,1,0,0, in this example. BRAM configuration data 705B, of which there can only be routing configuration data, is for a DSP to BRAM configuration translation namely the swap between DSP configuration data 705A and BRAM configuration data 705B which is a routing data to routing data exchange. Again, for a DSP to BRAM translation, the last frame, namely the DSP configuration frame 514 in the example of FIG. 5B, is removed. Thus, DSP configuration data 705A is frame equalized to provide BRAM configuration data 705B. Notably, again DSP configuration data may only include routing data for this translation to be valid. This translation would be invalid if there were actually DSP configuration data.

Partial bitstream 713 includes preamble 742, starting address 743, CLB configuration data 706, and postamble 745. Information for preamble 742 and postamble 745 may respectively be obtained from preamble 702 and postamble 707 of partial bitstream 701. Starting address 743, continuing the example of FIG. 6 above, may be obtained in association with CLB column 102-4, which in this example is address 0,0,0,9. CLB configuration data 706 is transferred from CLB configuration data 706 of partial bitstream 701.

Thus, it should be appreciated that each partial bitstream 711 through 713 obtained from a sequential parsing of partial bitstream 701 may be independently transferred for each associated configuration block, such as blocks 704 through 706. The reason for removing or padding frames, as previously described, is to ensure that the partial bitstreams with respect to all configuration data is bit-for-bit aligned for the horizontal transfer of different logic layers. However, the overall change in data volume for going from partial bitstream 701 to partial bitstreams 711 through 713 may generally be less than a 10% increase, and more particularly may be equal to or less than a 4%, increase.

Figure 8:
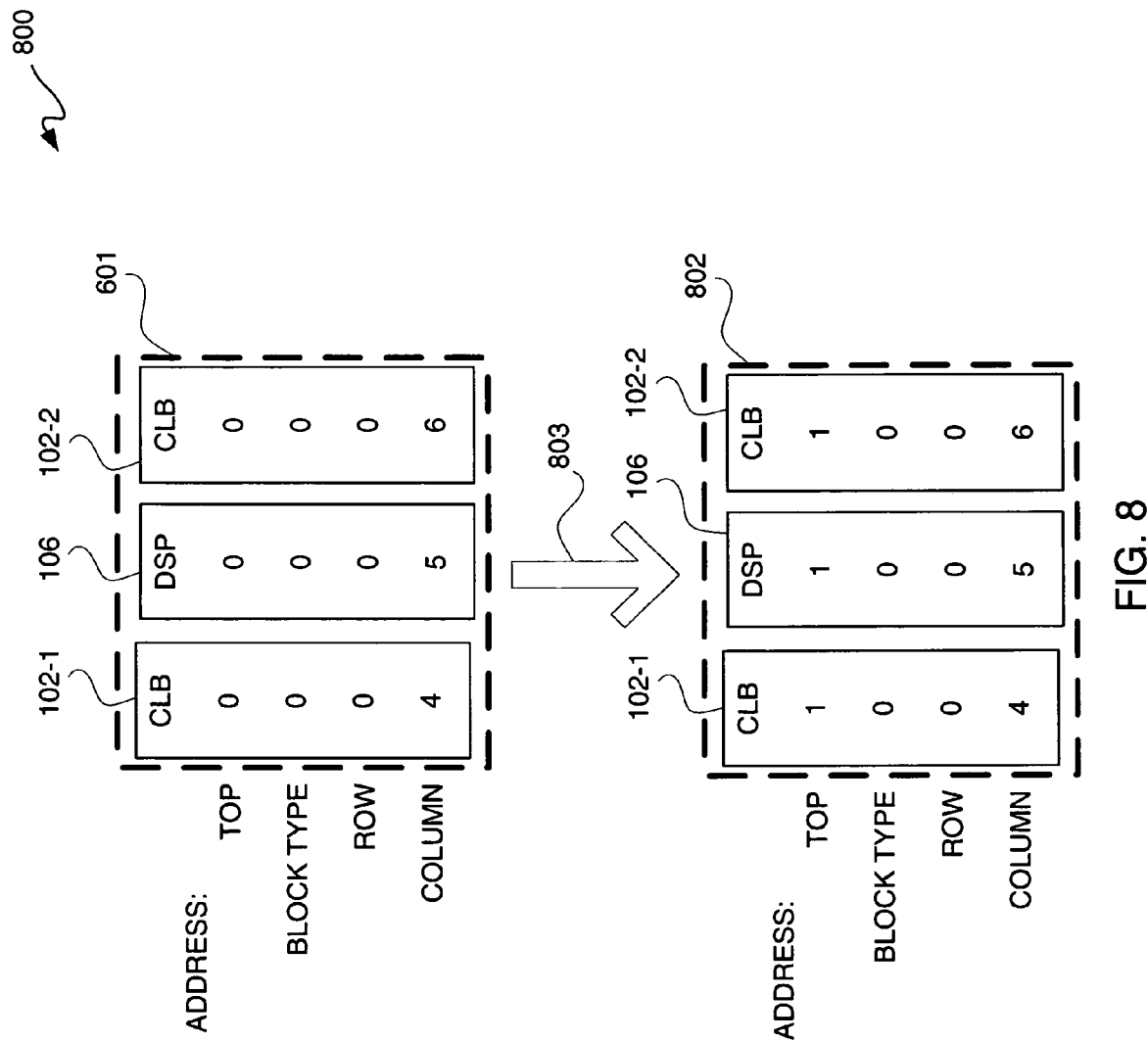
FIG. 8 is a block/flow diagram depicting an exemplary embodiment of a vertical translation flow.

FIG. 8 is a flow diagram depicting an exemplary embodiment of a vertical translation flow 800. Vertical translation flow 800 is to relocate a partial bitstream associated with original location 601 to relocation target 802 via a vertical transform 803. Again, location used herein may be an area as described above with reference to FIGS. 2 and 3. As previously mentioned, there may be in some FPGAs a bit reversal between top and bottom halves of a column. Accordingly, in order to transfer a partial bitstream from one area to another area even within the same columns, a vertical translation 803 may be used to handle any bit reversal. Notably, for some FPGAs, there may not be a complete reversal of configuration frames. For example, the middle word may not be reversed. However, for purposes of clarity by way of example and not limitation, it shall be assumed that exact mirroring is used for bit reversal of configuration frame bits.

Location 601 includes CLB columns 102-1 and 102-2 and DSP column 106. Assuming a vertical only translation, then vertical translation 803 is within the same columns, and thus relocation target 802 includes a portion of CLB column 102-1, a portion of DSP column 106, and a portion of CLB column 102-2. However, it should be apparent that the addresses between columns associated with location 601 and those associated with relocation target 802 are different. In particular, the top address bit is flipped for each of the three addresses from a logic 0 to a logic 1, which for a Xilinx FPGA indicates that relocation target 802 is in a bottom half of columns of a columnar architecture FPGA, such as FPGA 100 of FIG. 2. Notably, the translation may be reversed, namely starting from a bottom half and moving to a top half. Furthermore, the resulting translation may straddle top and bottom halves. Additionally, there may be different row addresses between original location 601 and relocation target 802. However, for clarity, same row addresses are used.

Figure 9:
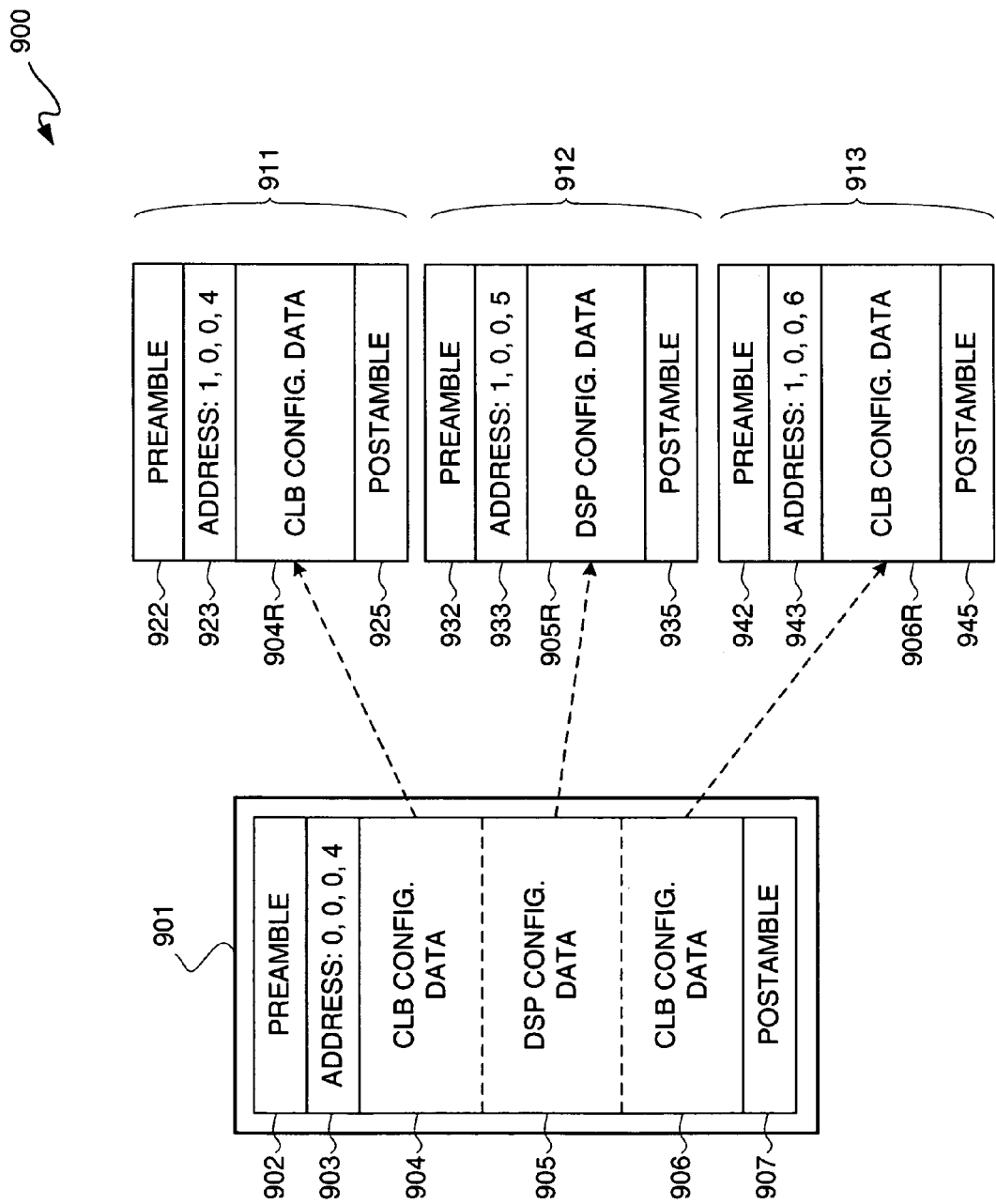
FIG. 9 is a block/flow diagram depicting an exemplary embodiment of sequential bitstream parsing flow using the example of the vertical translation of FIG. 7.

FIG. 9 is a block diagram depicting an exemplary embodiment of sequential bitstream parsing flow 900 of a partial bitstream 901 into partial bitstreams 911 through 913. Partial bitstream 901 includes preamble 902, starting address 903, CLB configuration data 904, DSP configuration data 905, CLB configuration data 906, and postamble 907. Continuing the above example of FIG. 8, starting address 903 is 0,0,0,4 associated with original location 601 in CLB column 102-1 prior to vertical translation 803. As a result of vertical translation 803, partial bitstreams 911 through 913 are generated.

Partial bitstream 911 includes preamble 922, starting address 923, CLB configuration data 904R, and postamble 925. Information for preamble 922 and postamble 925 may respectively be obtained from preamble 902 and postamble 907 of partial bitstream 901. Notably, for vertical translation without any horizontal translation there may be no prohibit constraints as logic layers are equivalent.

Starting address 923 of partial bitstream 911, continuing the example of FIG. 8, is 1,0,0,4 as associated with CLB column 102-1 of relocation target 802 after vertical translation 803. CLB configuration data 904R has its bits reversed in order. In other words, as partial bitstream 901 is a sequence of bits, the portion of that sequence associated with CLB configuration data 904 is flipped such that the order of those bits is reversed to provide CLB configuration data 904R of partial bitstream 911.

Partial bitstream 912 includes preamble 932, starting address 933, DSP configuration data 905R, and postamble 935. Information for preamble 932 and postamble 935 may be obtained from preamble 902 and postamble 907, respectively, of partial bitstream 901. Starting address 933, continuing the example of FIG. 8, is the address 1,0,0,5 as associated with the portion of DSP column 106 of relocation target 802 after vertical translation 803. DSP configuration data 905R is obtained by reversing the bit order of DSP configuration data 905 of partial bitstream 901. Notably, in contrast to the horizontal translation example of FIGS. 6 and 7, because this only a vertical translation going from DSP configuration data to DSP configuration data, there is no equalizing of non-matching numbers of frames in addition to having no prohibit constraints. Thus, both DSP routing and logic configuration data may be vertically translated.

Partial bitstream 913 includes preamble 942, starting address 943, CLB configuration data 906R, and postamble 945. Information for preamble 942 and postamble 945 may be obtained from preamble 902 and postamble 907, respectively, of partial bitstream 901. Starting address 943, continuing the example of FIG. 8, is 1,0,0,6 as associated with the portion of CLB column 102-2 of relocation target 802 after vertical translation 803. CLB-configuration data 906R is obtained by reversing the bit order of CLB configuration data 906 of partial bitstream 901.

Accordingly, it should be appreciated that for each of starting addresses 923, 933, and 943, for vertical translation the top bit may be flipped. This bit flipping may be used as a flag for bit reversal of configuration data. Notably, although a vertical translation has been shown as going from a top half to a bottom half of a column, the reverse translation may be done by flipping a top logic 1 address bit to a logic 0 and likewise reversing bit order of configuration data.

Although particular examples of addresses and types of portions of columns have been described, it should be appreciated that other addresses and other types of columns may be used. Furthermore, although both horizontal and vertical translation have been shown with a particular direction, such as from top to bottom or from left to right, the reverse directions may be used. Lastly, it should be appreciated that a modular partial bitstream need not be limited to either only a vertical translation or a horizontal translation, as previously described, but may involve a combination of both a horizontal and a vertical translation. This combination may be achieved by combining the partial bitstream sequential parsings described with reference to FIGS. 7 and 9 for example. Thus, if both vertical and horizontal translation were to take place, then the top address bits would be flipped and the configuration data for each of the partial bitstreams 711 through 713 would be reverse ordered after any frame equalization to provide a vertical and horizontal translation.

Figure 10:
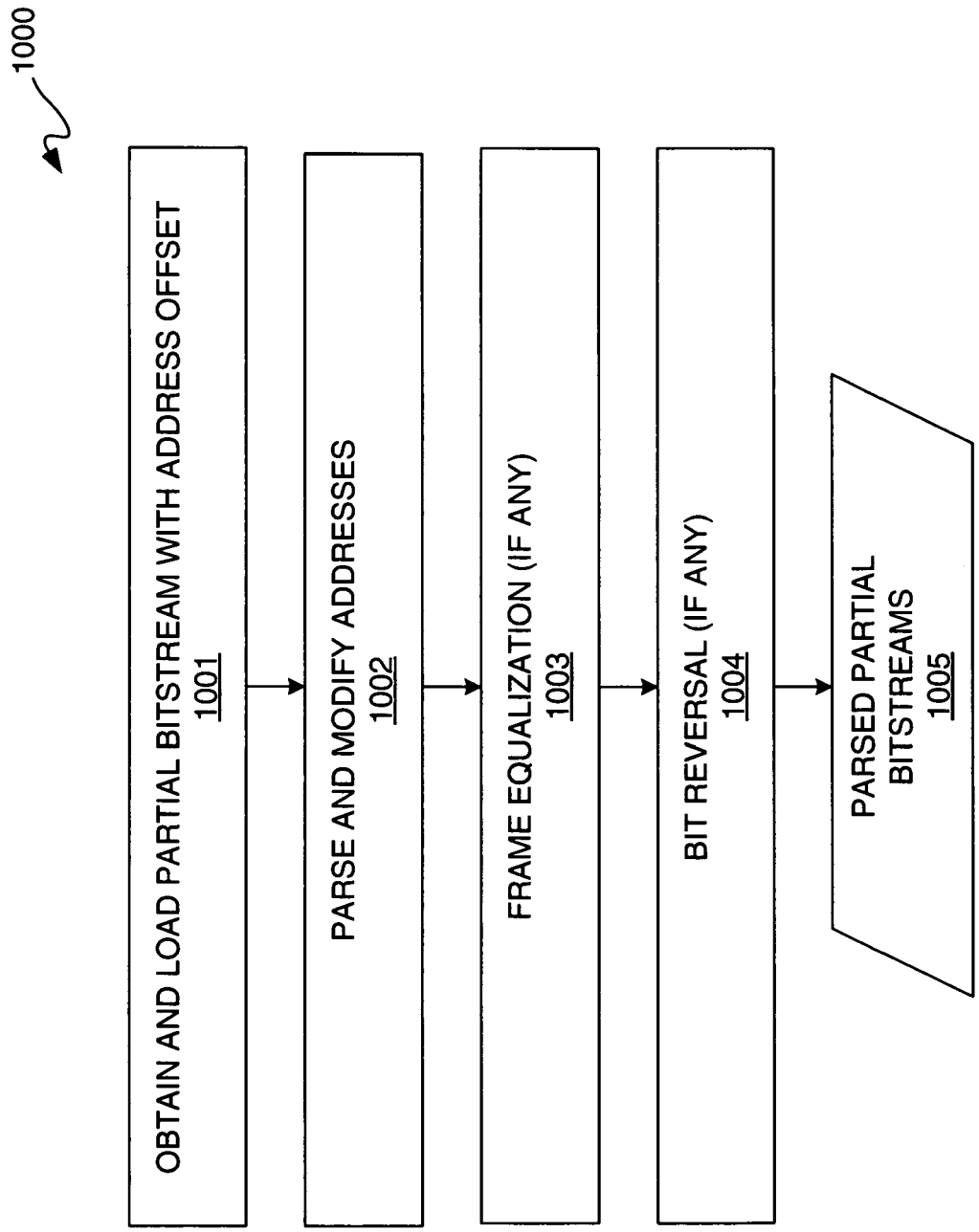
FIG. 10 is a flow diagram depicting an exemplary embodiment of a modular partial bitstream flow.

FIG. 10 is a flow diagram depicting an exemplary embodiment of a modular partial bitstream flow 1000. At 1001, a partial bitstream is obtained along with address offset values for relocating the partial bitstream to a target area. At 1002, the partial bitstream is modified with the address offset values to provide translated starting addresses. Additionally, if a bit reversal is involved, a top address bit may be flipped, and this bit flipping may be used as a flag for subsequent processing.

At 1003, if the relocation of the partial bitstream involves a horizontal translation to non-equivalent logic layers, frame equalization may be done. Notably, frame equalization at 1003 may be done before parsing and address modification at 1002. If a vertical translation is involved, bit reversal may be done on configuration data at 1004. Generally, it will be less complex if frame equalization is done before bit reversal; however, bit reversal at 1004 may be done before frame equalization. Notably, top bit flipping may be used as a flag to initiate bit reversal at 1004. Notably, there may not be vertical relocation or there may not be horizontal relocation for a partial bitstream, but at least one of vertical relocation or horizontal relocation, as described herein, is done. Output of flow 1000 is parsed partial bitstreams 1005.

It should be appreciated with reference to FIGS. 7 and 9 that each set of independent partial bitstreams, such as partial bitstreams 711 through 713 or 911 through 913, parsed from a larger partial bitstream, such as partial bitstreams 701 or 901, may, though need not, be collectively larger than the original partial bitstream from which they were parsed. For example, transformation from CLE to BRL reduces the number of frames, which may effect a result where the collection of new partial bitstreams is smaller than the original partial bitstreams. However, individually each such set of independent partial bitstreams is smaller than the original partial bitstream from which the independent partial bitstreams were parsed. Additionally, each of the resulting partial bitstreams parsed from a larger partial bitstream may be independently instantiated in an FPGA. Moreover, the parsed partial bitstreams may be instantiated in any order, as long as all parsed partial bitstreams of a set are instantiated. This facilitates remote reconfiguration, as parsed partial bitstreams may fit into transmission blocks and may be instantiated in the order in which they are received. This means that packets do not have to be buffered and reordered for instantiation. Each parsed partial bitstream may be thought of as a "mini-partial" configuration bitstream for independent partial reconfiguration. Such independent partial reconfiguration may be done on a packet by packet basis, as such packets are received. Notably, TCP or UDP packets may be used. With respect to the latter, presently maximum UDP packet size is 1.5 kilobytes. One UDP packet may contain configuration data for eight full frames as associated with a column of configuration memory of a Xilinx FPGA. However, an original location, and thus an associated relocation target, may, though need not, extend the length of an entire column, as previously indicated. Thus, the amount of configuration data associated with each column in a partial bitstream may be less than a full frames worth of data. Thus, it should be appreciated that a single UDP packet for example may hold an entire parsed partial bitstream.

Figure 11:
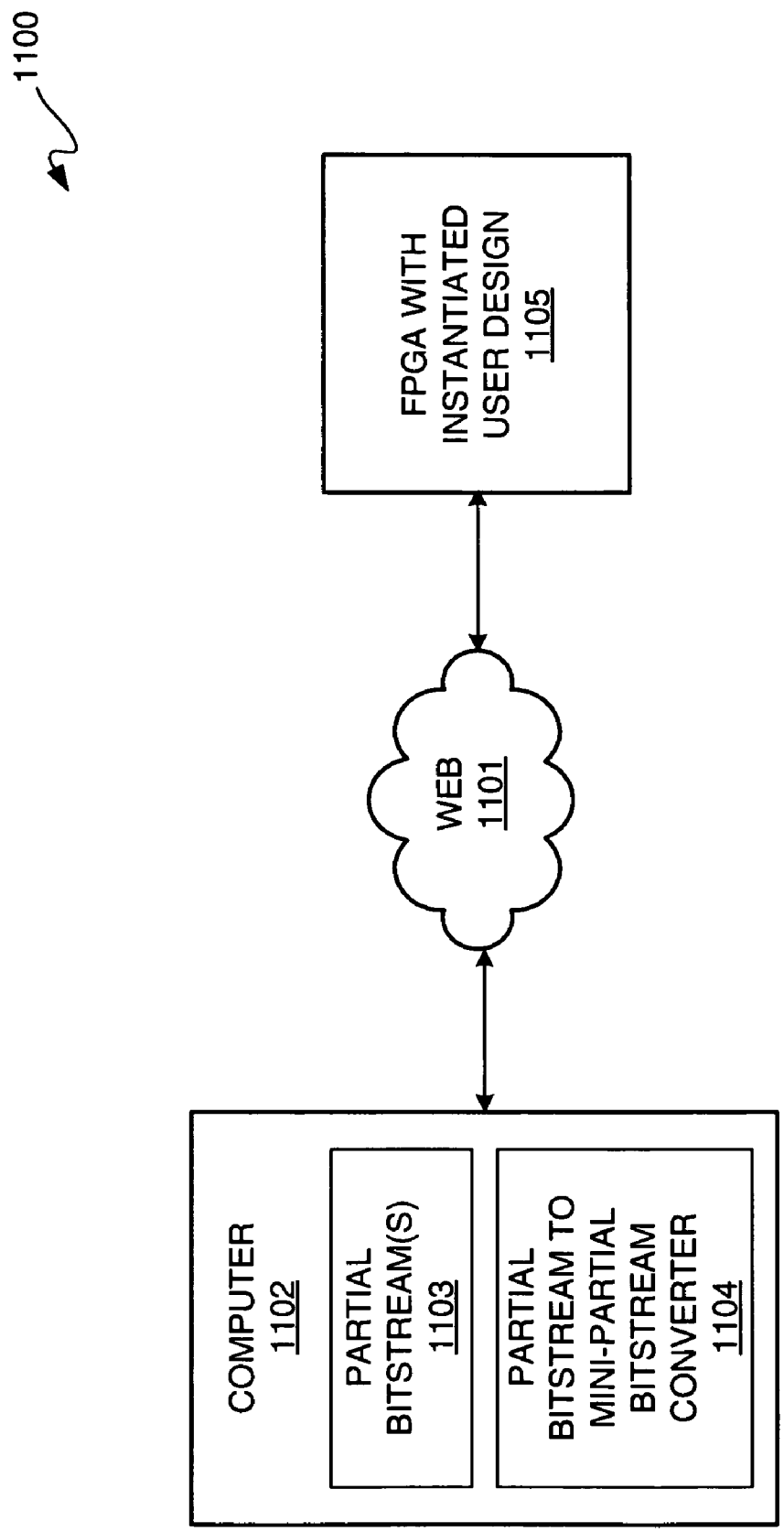
FIG. 11 is a network diagram depicting an exemplary embodiment of a remote partial reconfiguration for a network system.

FIG. 11 is a network diagram depicting an exemplary embodiment of a remote partial reconfiguration for a network system 1100. Computer 1102, which may be a work station computer, a personal computer, a notebook computer, or a PDA, or some other known device capable of storing data, may include one or more partial bitstreams 1103. Computer 1102 may be programmed with a partial bitstream to parsed partial bitstream converter 1104 in accordance with the preceding description, and thus one or more partial bitstreams 1103 may be parsed to provide parse partial or "mini-partial" configuration bitstreams. As previously described, such mini-partial bitstreams are relocatable. Alternatively, partial bitstreams 1103 may include or be mini-partial bitstreams already parsed from larger partial bitstreams, as previously described, and thus a storage device with web connectivity may be used.

Computer 1102 may be put in communication with FPGA 1105 via network 1101, which may include the Internet or other web-based network. Packets sent from computer 1102 may be instantiated in FPGA 1105. FPGA 1105 may previously have instantiated therein a user design. Thus, such mini-partial configuration bitstreams may be used to dynamically partially reconfigure FPGA 1105. Notably, because such mini-partial configuration bitstreams are sufficiently small, the Internal Configuration Access Port ("ICAP") of a Xilinx FPGA or a Dynamic Reconfiguration Port ("DRP") of a Xilinx FPGA may be used. Furthermore, it should be appreciated that because such mini-partial configuration bitstreams may be independently instantiated, there is limited buffering to be done. Furthermore, in UDP, packets are numbered, and thus it may be determined whether a packet has been lost and needs to be retransmitted. Furthermore, because mini-partial configuration bitstreams may be instantiated out of order, it is not necessary that packets are received in order.

Notably, variations to the example embodiments described above may be used. For example, an FPGA having an Ethernet media access controller ("EMAC"), which may be a hard or soft EMAC, or a Peripheral Component Interconnect ("PCI") bus connection suitable for interfacing to an Ethernet to PCI connection, may be used. Further, it should be appreciated that remote reconfiguration does not mean that the computer needs to be completely removed from the room in which the FPGA is located. Rather, it means that the computer need not be directly connected to the FPGA, but may be connected via a cable, over-the-air, or using both types of connection for communication of packets, cells, frames, or other groupings of data.

It should be appreciated that there are many possible applications for use of parsed partial bitstreams as previously described. For example, a software-defined radio may have different standards supported. These standards may vary by waveform, frequency, and encryption, among other factors. Accordingly, modules may be swapped in and out of an FPGA to provide support for the various different standards of a software-defined radio. Although the example of a software-defined radio is used, it should be appreciated that any circuit having to support a variety of different formats, may have modules swapped in and out using partial reconfiguration in accordance with the above description. Notably, relocation of an instantiated partial bitstream does not necessarily involve having to have the source partial bitstream instantiated prior to instantiation of a version thereof for relocation.

Figure 12:
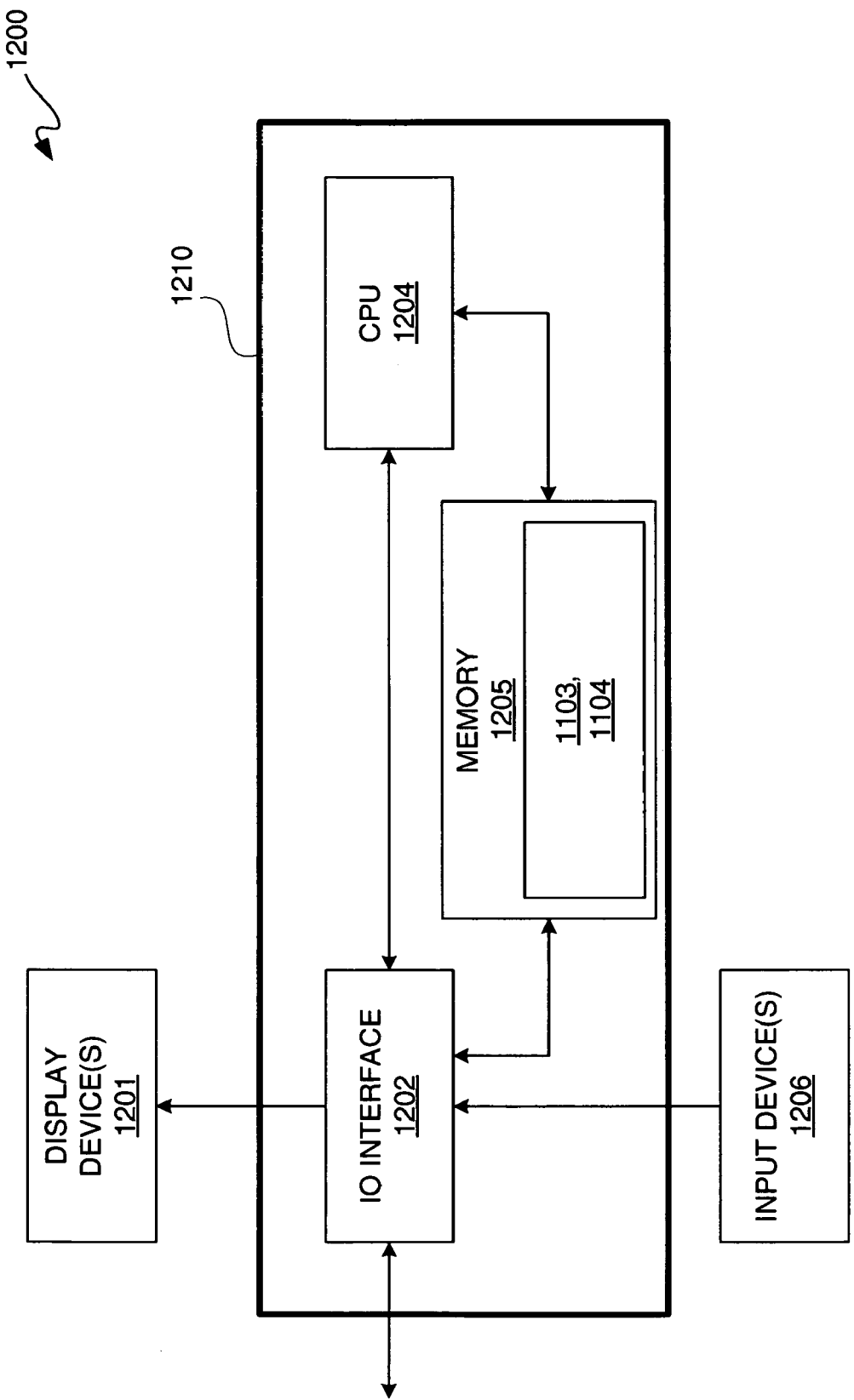
FIG. 12 is a high-level block diagram of an exemplary embodiment of a computer system.

FIG. 12 is a high-level block diagram of an exemplary embodiment of a computer system 1200. Computer system 1200 may include a programmed computer 1210 coupled to one or more display devices 1201, such as Cathode Ray Tube ("CRT") displays, Plasma displays, Liquid Crystal Displays ("LCD"), and to one or more input devices 1206, such as a keyboard and a cursor pointing device. Other known configurations of a computer system may be used.

Programmed computer 1210 may be programmed with a known operating system, which may be Mac OS, Java Virtual Machine, Linux, Solaris, Unix, or a Windows operating system, among other known platforms. Programmed computer 1210 includes a central processing unit (CPU) 1204, memory 1205, and an input/output ("IO") interface 1202. CPU 1204 may be a type of microprocessor known in the art, such as available from IBM, Intel, and Advanced Micro Devices for example. Support circuits (not shown) may include conventional cache, power supplies, clock circuits, data registers, and the like. Memory 1205 may be directly coupled to CPU 1204 or coupled through IO interface 1202. At least a portion of an operating system may be disposed in memory 1205. Memory 1205 may include one or more of the following: random access memory, read only memory, magneto-resistive read/write memory, optical read/write memory, cache memory, magnetic read/write memory, and the like, as well as signal-bearing media as described below.

IO interface 1202 may include chip set chips, graphics processors, and daughter cards, among other known circuits. An example of a daughter card may include a network interface card ("NIC"), a display interface card, a modem card, and a Universal Serial Bus ("USB") interface card, among other known circuits. Thus, IO interface 1202 may be coupled to a conventional keyboard, network, mouse, display printer, and interface circuitry adapted to receive and transmit data, such as data files and the like. Notably, programmed computer 1210 may be coupled to a number of client computers, server computers, or any combination thereof via a conventional network infrastructure, such as a company's Intranet and/or the Internet, for example, allowing distributed use for interface generation.

Memory 1205 may store all or portions of one or more programs or data to implement processes in accordance with one or more aspects of the invention to provide mini-partial bitstreams from partial bitstreams 1103 using partial bitstream to mini-partial bitstream converter 1104. Additionally, those skilled in the art will appreciate that one or more aspects of the invention may be implemented in hardware, software, or a combination of hardware and software. Such implementations may include a number of processors independently executing various programs and dedicated hardware or programmable hardware.

One or more program(s) of the partial bitstream to mini-partial bitstream converter 1104 as well as documents thereof, may define functions of embodiments in accordance with one or more aspects of the invention and can be contained on a variety of signal-bearing media, such as computer-readable media having code, which include, but are not limited to: (i) information permanently stored on non-writable storage media (e.g., read-only memory devices within a computer such as CD-ROM or DVD-ROM disks readable by a CD-ROM drive or a DVD drive); (ii) alterable information stored on writable storage media (e.g., floppy disks within a diskette drive or hard-disk drive or read/writable CD or read/writable DVD); or (iii) information conveyed to a computer by a communications medium, such as through a computer or telephone network, including wireless communications. The latter embodiment specifically includes information downloaded from the Internet and other networks. Furthermore, such signal-bearing media may be in the form of a carrier wave or other signal propagation medium via a communication link for streaming information, including downloading all or a portion of a computer program product. Such signal-bearing media, when carrying computer-readable instructions that direct functions of one or more aspects of the invention, represent embodiments of the invention.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Notably, even though completely separate relocation areas have been described, a relocation area may overlap in part with an original instantiation area and relocation areas may overlap with one another. Claim(s) listing steps do not imply any order of the steps. Trademarks are the property of their respective owners.

What is claimed is:

1. A method of enhancing relocatability of a partial bitstream from a first area to a second area of programmable components of an integrated circuit, the method comprising:

identifying a first set of resources of the programmable components associated with instantiation of the partial bitstream and a second set of resources of the programmable components targeted for relocation of functionality associated with the partial bitstream, the first set of resources being associated with the first area, the second set of resources being associated with the second area, the second area wholly or partially offset from the first area;

identifying differences between the first set of resources and the second set of resources, the differences associated with one or more different types of circuit resources in each of the first area and the second area;

setting prohibit constraints associated with the differences;

identifying a frame number difference between the first set of resources and the second set of resources;

equalizing a number of frames as between the first set of resources and the second set of resources for the frame number difference identified; and parsing by using a computer, the partial bitstream into separate partial bitstreams;

wherein the partial bitstreams have modified addresses responsive in part to the prohibit constraints for instantiation of the partial bitstreams in the second area for avoiding a first portion of the second set of resources different from a first portion of the first set of resources.

2. The method according to claim 1, wherein the first area and the second area span an equivalent number of rows and an equivalent number of columns of the programmable components.

3. The method according to claim 2, further comprising:

configuring the programmable components with a configuration bitstream, the configuration bitstream including the partial bitstream;

the partial bitstream being instantiated in the first area in the programmable components with the configuring;

unloading the partial bitstream from the first area of the programmable components; and the instantiating including masking off at least one section of the second area from use responsive to the prohibit constraints.

4. The method according to claim 3, wherein each of the partial bitstreams includes leading information, address information, configuration data, and trailing information.

5. The method according to claim 4, wherein the address information for each of the partial bitstreams is associated by circuit resource type.

6. The method according to claim 4, wherein the address information for the partial bitstreams is respectively associated by columns of the programmable components, each of the columns of the programmable components being homogenous with respect to substantially identical circuit blocks thereof.

7. The method according to claim 6, wherein the substantially identical circuit blocks for the columns include one or more blocks selected from a group consisting of: digital signal processing blocks, random access memory blocks, input/output blocks, and multi-gigabit transceiver blocks.

8. The method according to claim 6, wherein the integrated circuit is a programmable logic device.

9. The method according to claim 1, wherein the partial bitstream is for a module of a design.

10. The method according to claim 1, further comprising:

instantiating the partial bitstreams in the second area using a second portion of the second set of resources equivalent to a second portion of the first set of resources for imparting the functionality associated with the partial bitstream thereto.

11. A modular configuration bitstream stored on a computer storage device and executed by a computer for configuration of programmable components of an integrated circuit, comprising:

a plurality of block bitstreams, each of the block bitstreams having various sections, the block bitstreams being derived from a partial bitstream associated with a reference layer, wherein configuration data from the partial bitstream is divided into data blocks and each data block is used for providing a respective one of the block bitstreams;

wherein the reference layer being a first ordered set of circuit and configuration memory resources associated with a first location in the programmable components for instantiation of the partial bitstream;

a first portion of the block bitstreams associated with instantiation of a module of a user design in the programmable components;

a second portion of the block bitstreams associated with a masked off portion of the programmable components;

the first portion and the second portion being associated with a target layer offset from the reference layers;

wherein the target layer being a second ordered set of circuit and configuration memory resources associated with a second location in the programmable components for instantiation of the block bitstreams;

wherein the target layer not having to be equivalent to the reference layer with respect to the first ordered set of stripes of circuit and configuration memory resources being equivalent to the second ordered set of circuit and configuration memory resources responsive to the second portion of the block bitstreams masking off the portion of the programmable components of the second ordered set of circuit and configuration memory resources that is not equivalent to the first ordered set of circuit and configuration memory resources;

a frame number difference between a first set of resources associated with the partial bitstream and a second set of resources associated with the block bitstreams; and wherein the frame number difference is equalized such that the first set of resources has equal number of frames as the second set of resources;

wherein the partial bitstream is parsed into separate partial bitstreams to provide the first portion of the block bitstreams, wherein the partial bitstreams have modified addresses responsive in part to prohibit constraints associated with the second portion of the block bitstreams for instantiation of the first portion of the partial bitstreams in the target area while avoiding the masked off portion of the programmable components thereof.

12. The modular configuration bitstream according to claim 11, wherein the various sections of each of the block bitstreams include a leading information section, an address section, a configuration data section, and a trailing information section, the address section including an address modified for horizontal translation for relocation of a user circuit design associated with the partial bitstream.

13. The modular configuration bitstream according to claim 12, wherein the address is further modified for vertical translation for the relocation of the user circuit design associated with the partial bitstream.

14. The method according to claim 11, wherein the first portion of the block bitstreams is instantiated in the target area of the programmable components for imparting functionality associated with the partial bitstream thereto.

15. A computer-readable storage device having computer-executable instructions for performing a method of enhancing relocatability of a partial bitstream from a first area to a second area of programmable components of an integrated circuit, the method comprising:

identifying a first set of resources of the programmable components associated with instantiation of the partial bitstream and a second set of resources of the programmable components targeted for relocation of functionality associated with the partial bitstream, the first set of resources being associated with the first area, the second set of resources being associated with the second area, the second area wholly or partially offset from the first area;

identifying differences between the first set of resources and the second set of resources, the differences associated with one or more different types of circuit resources in each of the first area and the second area;

setting prohibit constraints associated with the differences;

identifying a frame number difference between the first set of resources and the second set of resources;

equalizing a number of frames as between the first set of resources and the second set of resources for the frame number difference identified; and parsing the partial bitstream into separate partial bitstreams, wherein the partial bitstreams have modified addresses responsive in part to the prohibit constraints for instantiation of the partial bitstreams in the second area for avoiding a first portion of the second set of resources different from a first portion of the first set of resources.

16. The computer-readable storage device of claim 15, wherein the first area and the second area span an equivalent number of rows and an equivalent number of columns of the programmable components.

17. The computer-readable storage device of claim 15, further comprising:

configuring the programmable components with a configuration bitstream, wherein the configuration bitstream includes the partial bitstream;

instantiating the partial bitstream in the first area in the programmable components; and unloading the partial bitstream from the first area of the programmable components, wherein the instantiating includes masking off at least one section of the second area from use responsive to the prohibit constraints.

* * * * *